United States Patent
Hashizume et al.

[11] Patent Number: 5,945,353
[45] Date of Patent: Aug. 31, 1999

[54] PLASMA PROCESSING METHOD

[75] Inventors: Junichiro Hashizume; Shigenori Ueda, both of Nara; Shinji Tsuchida, Tsuzuki-gun, all of Japan

[73] Assignee: Canon Kabushiki Kaisha, Tokyo, Japan

[21] Appl. No.: 08/942,119

[22] Filed: Oct. 1, 1997

Related U.S. Application Data

[62] Division of application No. 08/404,496, Mar. 17, 1995, Pat. No. 5,718,769.

[30] Foreign Application Priority Data

Mar. 22, 1994 [JP] Japan .................................. 6-049661

[51] Int. Cl.$^6$ ................................................. H01L 21/302
[52] U.S. Cl. ............................................ 438/729; 427/569
[58] Field of Search ............................... 118/723 E, 730; 427/569; 438/710, 729

[56] References Cited

U.S. PATENT DOCUMENTS

| | | | |
|---|---|---|---|
| 4,915,978 | 4/1990 | Von Campe et al. ................. | 427/38 |
| 4,958,591 | 9/1990 | Yamazaki ............................. | 118/723 |
| 5,175,021 | 12/1992 | Bonsaver et al. ..................... | 427/569 |
| 5,370,737 | 12/1994 | Mathis ................................. | 118/723 E |
| 5,540,781 | 7/1996 | Yamagami et al. ................... | 118/723 E |

*Primary Examiner*—Joni Chang
*Attorney, Agent, or Firm*—Fitzpatrick, Cella, Harper & Scinto

[57] ABSTRACT

In a plasma processing method and apparatus for carrying out plasma processing by supplying a high-frequency power of 20 MHz to 450 MHz to cause discharge to take place between a first electrode serving also as a film forming substrate and a second electrode provided so as to surround the first electrode, the high-frequency power is supplied from its power source to the second electrode at two points at least. In plasma processing apparatuses as typified by plasma CVD apparatuses to which the high-frequency power of a frequency from 20 MHz to 450 MHz is supplied, this method and apparatus can effectively decrease unevenness in plasma processing in the peripheral direction of the film formed, can promise a high plasma processing rate and can improve the characteristics of a deposited film during deposited film formation.

4 Claims, 3 Drawing Sheets

PLASMA PROCESSING METHOD

This application is a division of application Ser. No. 08/404,496 filed Mar. 17, 1995, now U.S. Pat. No. 5,718,769.

BACKGROUND OF THE INVENTION

1. Field of the Invention

This invention relates to a plasma processing method and a plasma processing apparatus. More particularly, this invention relates to a plasma processing method and apparatus that can form non-single-crystal functional deposited films used as semiconductor layers of semiconductor devices such as, in particular, photoelectric transducers including electrophotographic photosensitive members, image input line sensors or image pick-up devices, optical input devices as typified by photovoltaic devices usable as solar cells, and active devices such as diodes and TFTs (thin film transistors).

2. Related Background Art

Vacuum processing apparatuses as typified by plasma processing apparatuses used in the fabrication of semiconductor devices are used under appropriate conditions adapted to various processing methods carried out according to respective steps and uses. For example, in film formation, apparatuses and methods making the most of their features are used in various manners such that oxide films, nitride films or amorphous silicon semiconductor films are formed by plasma CVD using a plasma CVD apparatus, metal-wiring films are formed by sputtering using a sputtering apparatus, and fine patterns are formed by dry etching using an etching apparatus.

In recent years, there is also an increasing demand for improvements in film quality of films formed and their processing capacity, and various means therefor have been studied.

In particular, plasma processing that utilizes a high-frequency power is preferably employed in many fields because of its various advantages. For example, it ensures a high discharge stability and can be used also in forming insulating materials such as oxide films and nitride films.

Figure 1:
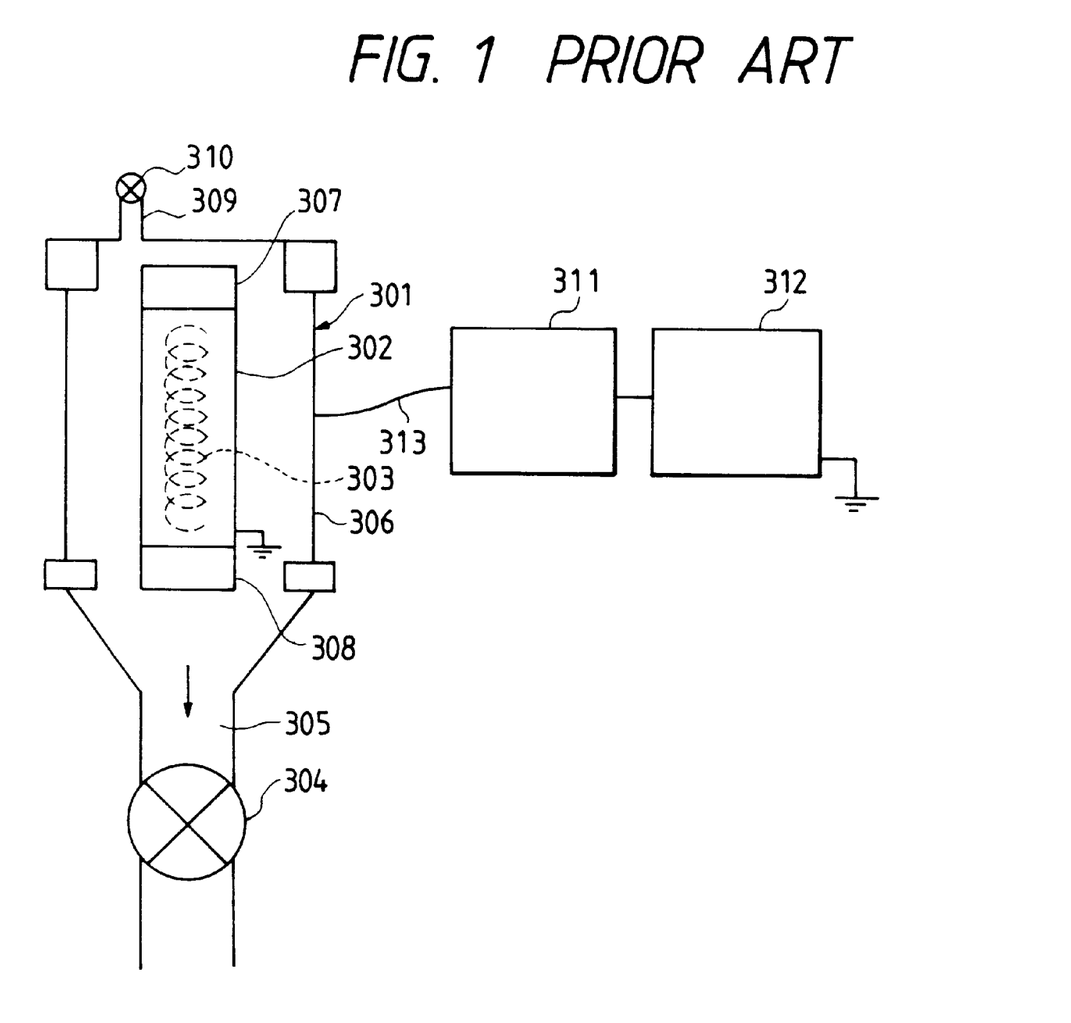
FIG. 1 is a schematic structural view to illustrate an example of a conventional deposition film forming apparatus, a plasma processing apparatus.

Hitherto, the oscillation frequency assigned to high-frequency power sources for discharging commonly used in plasma processing such as plasma CVD is 13.56 MHz. An example of such conventional plasma CVD apparatuses commonly in wide use to form deposited films is shown in FIG. 1. The plasma CVD apparatus diagrammatically illustrated in FIG. 1 is a film forming apparatus suitable when an amorphous silicon film (hereinafter "a-Si film") is formed on a cylindrical substrate for an electrophotographic photosensitive member.

The formation of an a-Si film by the use of this apparatus will be described below.

A reaction chamber (a deposition chamber) 301 that can be evacuated has a cylindrical second electrode 306 and is provided with a cylindrical first electrode constituting a film forming substrate (a substrate for an electrophotographic photosensitive member) 302 as an opposing electrode set opposingly to the second electrode 306. To both ends of the film forming substrate (first electrode) 302, auxiliary substrates 307 and 308 are respectively fitted to constitute part of the first electrode. In order to improve uniformity in film thickness and film properties, the dimension of the second electrode 306 in its cylinder shaft direction is set substantially the same as the total of the lengths of the film forming substrate (first electrode) 302 and auxiliary substrates 307 and 308 in their cylinder shaft direction. The first electrode, film forming substrate 302 is heated from its inside by means of an internal heating element 303. A high-frequency power source 312 is only single-point connected to the second electrode 306 by a cable 313 through a matching circuit 311. The deposition chamber 301 is provided with a vacuum exhaust tube 305 and is connected to an exhaust means (not shown) such as a vacuum pump via a main valve 304. The deposition chamber 301 is also provided with a material gas inlet 309 from which a material gas is fed into the chamber via a material gas feed valve 310.

Films are formed, for example, in the following way.

The film forming substrate 302 serving also as the first electrode is placed inside the deposition chamber 301, and then the main valve 304 is opened to evacuate the inside of the deposition chamber 301 through the evacuation tube 305. Thereafter, the material gas feed valve 310 is opened to feed an inert gas into the chamber through the material gas inlet 309, and its flow rate is adjusted to provide a given pressure. The heating element 303 is electrified to heat the film forming substrate 302 to a desired temperature of from 100° C. to 400° C.

Thereafter, a film forming material gas, e.g., a desired material gas selected from silane gas, disilane gas, methane gas, ethane gas and so forth, and also optionally a doping gas such as diborane gas or phosphine gas, are fed into the deposition chamber 301 through the material gas feed valve 310, and the exhaust velocity is adjusted to maintain the pressure at tens of Torr to hundreds of mTorr.

A high-frequency power of 13.56 MHz is supplied from the high-frequency power source 312 to the second electrode 306 single-point connected to the second electrode 306 by the cable 313 through the matching circuit 311, to generate plasma discharge between the second electrode 306 and the film forming substrate 302, where the material gases fed are decomposed to deposit an a-Si film on the film forming substrate 302 serving also as the first electrode. In the course of this deposition, the first electrode is heated by the heating element 303 to about 100° C. to 400° C.

If necessary, the film forming substrate may be rotated by means of a rotating mechanism (not shown) so that the film thickness distribution in the peripheral direction can be improved.

In this film forming process, the deposition rate for obtaining a-Si films satisfying the performance of electrophotographic photosensitive members is a deposition rate of, e.g., about 0.5 to 6 $\mu$m per hour. If the deposition rate is made higher than that, the properties required for photosensitive members may be diminished, or no desired performance can be achieved in some instances. Also, when a-Si films are utilized in electrophotographic photosensitive members, it is commonly considered necessary for the films to be in a thickness of at least 20 $\mu$m to 30 $\mu$m in order to obtain a chargeability. Hence, it has taken a long time to produce electrophotographic photosensitive members. Thus, a technique that can produce them in a shorter time without lowering the properties required for photosensitive members has been sought.

A report on a plasma CVD method making use of a high-frequency power source of 20 MHz or more, carried out using a parallel-plate plasma CVD apparatus (Plasma Chemistry and Plasma Processing, Vol. 7, No. 3, 1987, pp. 267–273), shows a possibility that the deposition rate can be improved without lowering the performance of deposited film when the discharge frequency is made higher than the conventional frequency 13.56 MHz, and has attracted notice. Making the discharge frequency higher in this way is also reported in sputtering techniques, and in recent years its advantage has been extensively studied.

Now, when films are formed using the above plasma CVD apparatus and in the same manner as the conventional method except that the power is replaced with a high-frequency power of a discharge frequency higher than the conventional frequency 13.56 MHz, it is certainly possible to ascertain that films can be formed in a higher deposition rate than conventional cases. In such a case, however, it has been found that the following problems may occur which have not been questioned in the case of the discharge frequency of 13.56 MHz.

That is, when films are formed while rotating the film forming substrate 302, it is true that films having substantially the same properties as those of conventional films can be deposited and also as a matter of course can be deposited in a uniform film thickness distribution in the peripheral direction. However, it has been found that the film thickness becomes uneven in the peripheral direction and great uneven film thickness distribution occurs when films are formed when the film forming substrate is set stationary, as when using a deposited film forming apparatus from which the mechanism for rotating the film forming substrate is omitted or without operating the rotating mechanism so that the apparatus can enjoy a cost reduction and its maintenance can be made less troublesome. More specifically, it has become clear that, in practice, the state of plasma generated in the apparatus is fairly localized in the peripheral direction and also the deposition rate greatly differs at some portions. Such an uneven film thickness distribution is considered not to occur on the surface when films are formed while rotating the film forming substrate.

It has been also found that what differs in the peripheral direction is not only the deposition rate, but also the electrophotographic performance of deposited films, the latter being fairly different at some portions. This uneven performance cannot be explained from only the difference in thickness of deposited films, and hence the film quality itself of the deposited film is presumed to be different in its peripheral direction. It has been also found that the photosensitive member has a better performance at portions with a good film quality in the peripheral direction than a photosensitive member on which the film has been formed while rotating the film forming substrate, and on the other hand has a poorer performance at portions with a poor film quality in the peripheral direction than the photosensitive member on which the film has been formed while rotating the film forming substrate. Namely, in the photosensitive member on which the film has been formed while rotating the film forming substrate, it is presumed that a film with poor properties and a film with good properties are formed in layers and hence an averaged performance is exhibited.

As discussed above, in the film formation using a high-frequency power of a frequency higher than the conventional 13.56 MHz, the film thickness distribution and film properties become uneven in the peripheral direction when films are formed when the film forming substrate is stationary. As a result, in workpieces with a relatively large area, such as electrophotographic photosensitive members, uneven images, problematic in practical use, have often occurred.

In the case when films are formed while rotating the substrate to be processed, the film with good properties and the film with poor properties are inevitably formed in layers because of the localization of plasma, so that film properties totally deteriorate so that good film properties cannot be obtained which should have been.

Such uneven deposition rate and film properties may cause a great problem when for functional deposited films formed of non-single-crystal materials, including amorphous or microcrystalline materials, which are useful not only for electrophotographic photosensitive members but also image input line sensors, image pick-up devices, photovoltaic devices and so forth. Also, in the case of other plasma processing such as dry etching and sputtering, similar uneven processing may result when the discharge frequency is made higher, and may cause a great problem in practical use.

SUMMARY OF THE INVENTION

An object of the present invention is to provide a plasma processing method and a plasma processing apparatus that have overcome the above problems in the prior art, and enable uniform plasma processing on substrates with a relatively large area at a high processing speed that has not been achievable in the conventional plasma processing.

Another object of the present invention is to provide a plasma processing method and a plasma processing apparatus that can enjoy a shorter processing time and a lower cost and can form deposited films most suitable for producing semiconductor devices as typified by electrophotographic photosensitive members having superior image characteristics.

Still another object of the present invention is to provide a plasma processing method and a plasma processing apparatus that enable uniform and high-speed plasma processing on substrates with a large area even when plasma processing that utilizes a high-frequency power of 20 MHz to 450 MHz is carried out.

A further object of the present invention is to provide a plasma processing method and a plasma processing apparatus that not only can form deposited films at a high rate but also can make their film thickness uniform and achieve an improvement in film quality, and also can achieve more cost reduction and higher performance of the semiconductor devices produced.

The present invention provides a plasma processing apparatus comprising a reaction chamber provided with a first electrode to be placed in a space that can be evacuated and a second electrode disposed so as to surround the first electrode, wherein the second electrode is connected to a high-frequency power supply means at at least two points.

The present invention also provides a plasma processing method carried out in a reaction chamber provided with a first electrode placed in a space that can be evacuated and a second electrode disposed to surround the first electrode, the method comprising supplying a high-frequency power to the second electrode to generate plasma to carry out plasma processing on the first electrode, wherein the high-frequency power is supplied to the second electrode at at least two points.

DESCRIPTION OF THE PREFERRED EMBODIMENTS

The present inventors made extensive studies in order to solve the problem of uneven film thickness distribution and film properties in the peripheral direction, occurring when films are formed the film forming substrate is stationary and using a high-frequency power of 20 MHz to 450 MHz.

They first made experiments to ascertain the positional relationship between the film thickness unevenness and the position at which a high-frequency power was supplied into the reaction chamber. As a result, unexpectedly it has been found that the film thickness distribution occurs without correlation with the position at which the high-frequency power is supplied into it. The reason therefor is unclear at present. It is presumed that the inductance component of the second electrode (the cathode) to which the power is applied becomes non-negligible when the high-frequency power of from 20 MHz to 450 MHz is used, which is within what is called the VHF range. If, however, only the inductance is questioned, it should follow that the deposition rate becomes higher on the side where the high-frequency power is applied, i.e., the side on which a cable is connected, and the deposition rate becomes lower on the opposite side that becomes physically distant from the side where it is applied, i.e., the position at which the cable is connected. The fact that there is no correlation with the position implies a possibility that in this frequency range not only the inductance of the second electrode comes into question but also the capacitance between the first electrode and the second electrode comes into question. Namely, in the frequency range of from 20 MHz to 450 MHz, the film forming space itself including the deposition chamber and the film forming substrate forms a series resonance circuit of inductance and capacitance, and the high-frequency power increases at a position that satisfies the resonance condition:

$$\omega = 1/(L \cdot C)^{1/2},$$

resulting in an increase in the decomposition rate of a material gas, as so presumed. In the above, L is inductance and C is capacitance.

Electrical characteristics of films deposited on film forming substrates were also measured after the film formation. As a result, it has been found that films formed at a higher deposition rate show better characteristics than films formed at a lower deposition rate. Usually, the lower the deposition rate is, the better the film properties become. In this case, however, the supply of a sufficient high-frequency energy to material gases is presumed to contribute an improvement in film properties.

The above experiments have led to a view on a possibility that a uniform film thickness in the peripheral direction can be achieved without rotating the film forming substrate so long as the power can be supplied uniformly in the peripheral direction of the second electrode when films are formed at a high frequency power of from 20 MHz to 450 MHz, and the film quality of deposited films can also be improved because a sufficient power can be supplied.

On the basis of the above findings, in the present invention, a high frequency power of from 20 MHz to 450 MHz is applied to plural points on the second electrode in its peripheral direction to satisfy the LC series resonance condition at plural sites inside the deposition chamber so that the high-frequency power can be sufficiently supplied overall in the peripheral direction.

In applying the high-frequency power to the plural points, a single high-frequency power source may preferably be used, where the power is divided after it has passed through a matching circuit, and is then applied to the plural points of the second electrode. If plural high-frequency power sources are used to apply the high-frequency power to the second electrode through respective matching circuits, the mutual high-frequency power sources may interfere with one another to make the operation of matching circuits unstable, and also the power may come backward to one high-frequency power source from another high-frequency power source to cause a faulty operation. Such difficulties do not occur at all when a single high-frequency power source is used to divide the power.

In supplying power to the plural points of the second electrode through a matching circuit from a single high-frequency power source, the distance of the wiring extending from the matching circuit up to the second electrode may preferably be as short as possible. If the wiring is too long, it may become impossible to effect matching well.

The present invention will be described below in greater detail with reference to the accompanying drawings.

Figure 2:
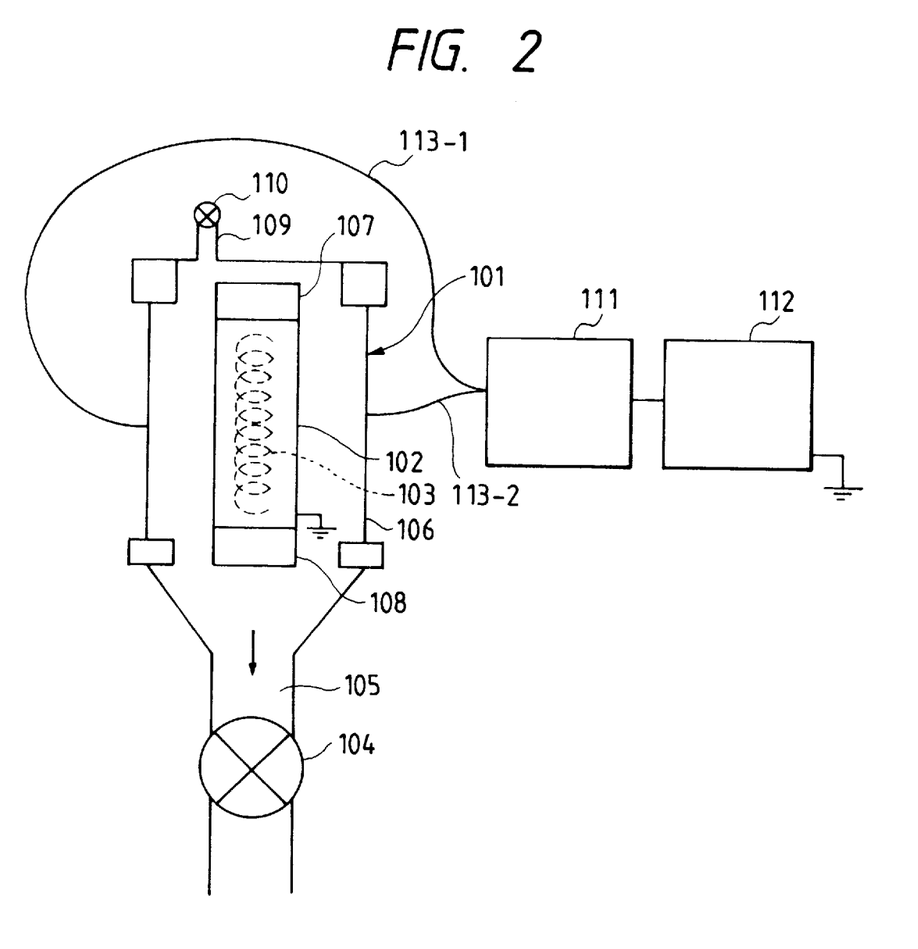
FIG. 2 is a schematic structural view to illustrate a preferred example of a deposited film forming apparatus, a plasma processing apparatus, according to the present invention.

FIG. 2 diagrammatically illustrates a preferred embodiment of the plasma processing apparatus of the present invention, which is suitable for the preparation of deposited films on cylindrical substrates as used in electrophotographic photosensitive members. In FIG. 2, reference numeral 101 denotes a deposition chamber having a film forming space in which a deposited film is formed, which is connected with an exhaust apparatus (not shown) via main valve 104 through an exhaust tube 105. Reference numeral 109 denotes a material gas inlet for feeding material gases into the deposition chamber, through which material gases are fed into the deposition chamber from a gas feed apparatus (not shown) via a material gas feed valve 110. Reference numeral 102 denotes a film forming substrate electrically connected to a ground, which substrate serves also as the first electrode. The film forming substrate 102 is also provided with auxiliary substrates 107 and 108 at its upper and lower ends as viewed in the drawing. Reference numeral 103 denotes a heating element for heating the film forming substrate 102 to a given temperature. The film forming substrate 102 may be optionally rotated by a rotating mechanism (not shown) so that the film thickness in the peripheral direction can be made more uniform. Reference numeral 112 denotes a high-frequency power source that generates a high-frequency power of from 20 MHz to 450 MHz, which is connected by cables in such a way of wiring that the high-frequency output is applied through a matching circuit 111 to the second electrode 106 at its plural points. In the embodiment shown in FIG. 2, cables 113-1 and 113-2 are respectively connected to the second electrode 106 at two points symmetrically located at an angle of 180° around the second electrode 106. As shown in the drawing, the second electrode 106 may of course serve also as the inner wall of the deposition chamber 101.

Figure 3A:
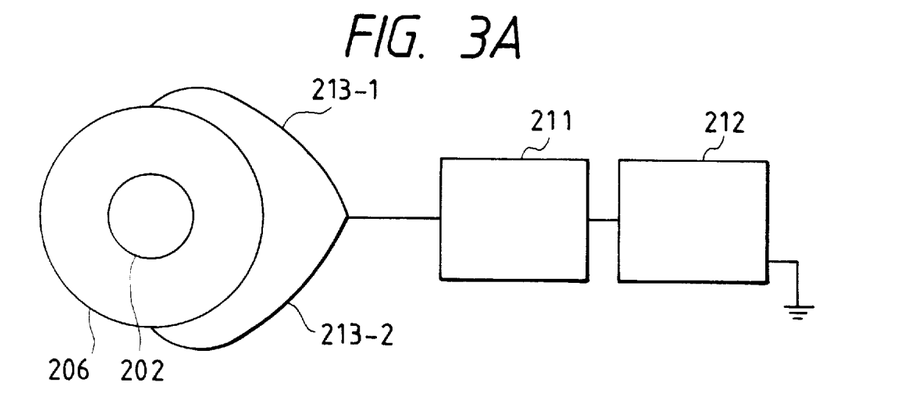
FIGS. 3A to 3C are schematic sectional views to illustrate other preferred examples of the deposited film forming apparatus, a plasma processing apparatus, according to the present invention.
Figure 3B:
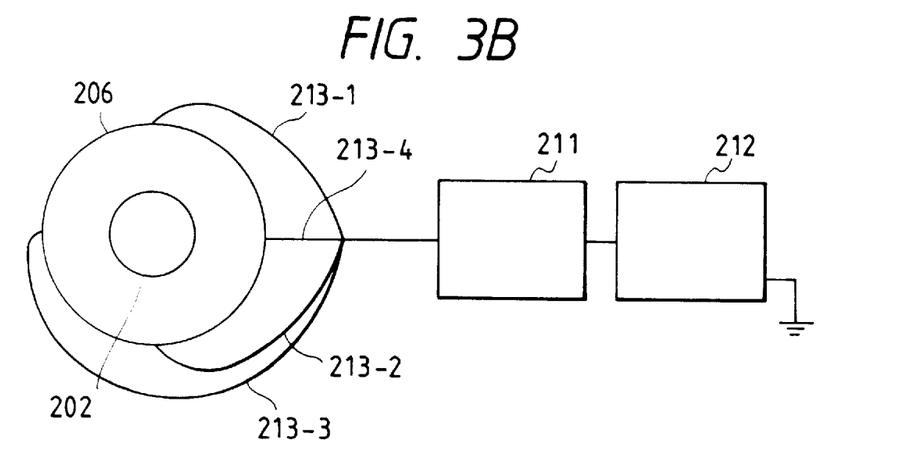
Figure 3C:
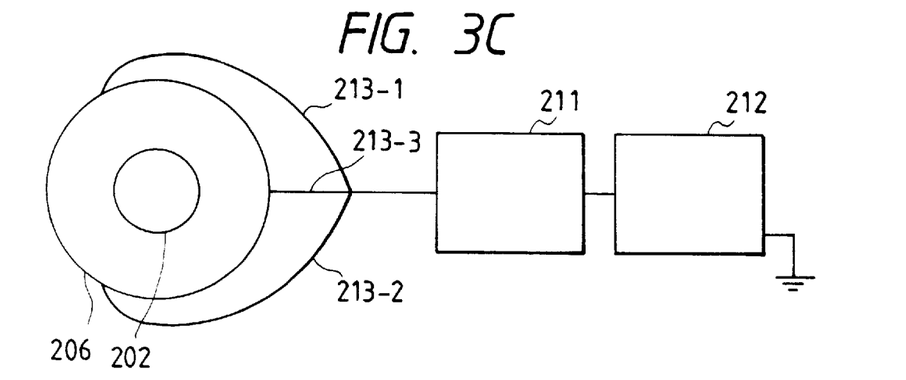

FIGS. 3A to 3C are schematic cross sections as viewed from the top, of other embodiments of the plasma processing apparatus for carrying out the formation of deposited films by the method of the present invention. FIG. 3A shows an embodiment in which the power is applied to the second electrode at two points as in FIG. 2. As shown in this drawing, the power is supplied through cables 213-1 and 213-2 at two points located at an angle of 180°, making turns by 90° as viewed from the position of the matching circuit. Needless to say, the same effect can be obtained also when the power is supplied at one point on the side of the matching circuit and at one point on the side opposite thereto or supplied at two points arbitrarily located so as to be at an angle of 180° to each other around the second electrode. The two points at which the power is supplied need not necessarily be at an angle of 180° to each other, and the present invention can be effective also when they are at an angle smaller than that. An angle which is close to 180° as far as possible is preferred to obtain the effect of the present invention under conditions of a wider range.

FIG. 3B shows an embodiment in which the power is supplied at four points by the use of cables 213-1, 213-2, 213-3 and 213-4. In this embodiment also, the mutual location of power supply points may preferably be at accurately 90°, but need not necessarily be so. The present invention can be effective so long as the points are located substantially in four equal parts. Their positional relation to the matching circuit may also be arbitrary.

FIG. 3C shows an embodiment in which the power is supplied at three points by the use of cables 213-1, 213-2 and 213-3. In the illustration in these drawings, the lengths of the respective wiring cables are different, but their lengths may preferably be as uniform as possible. This is due to the fact that a shorter wire readily conducts the high-frequency power and hence the film formation rates may differ. The length of wiring may also preferably be as short as possible taking account of the readiness for matching. In the embodiments shown in FIGS. 3A to 3C, the power is supplied at two to four points. Needless to say, the present invention can be effective also when it is supplied at more than four points.

With regard to the shaft-directional location for supplying the high-frequency power to the second electrode, the power is usually supplied at substantially the middle of the second electrode, and may optionally be supplied at any position in the shaft direction, where the present invention can be similarly effective. The present invention can also be effective when the respective points at which the high-frequency power is supplied are set a little aside in the shaft direction.

As materials used in the cables (wiring conductors) extending from the matching circuit to the second electrode, any materials may be used so long as they have a high conductivity. Materials used may preferably be those having a small permeability for the purpose of making the inductance of the wiring itself as small as possible. Also, since only the outermost surface of a conductor conducts the high-frequency power by virtue of the skin effect, the cables may preferably be in such shapes that the surface area is as large as possible. Usually the wiring conductors may be in the shape of flat plates (rectangular in cross section). Such materials may specifically include copper, aluminum, gold, silver, platinum, lead, nickel, cobalt, iron, chromium, molybdenum and titanium, or alloys containing as a main component a metal or metals selected from these (e.g., stainless steel), and also composite materials of two or more materials among these.

As the high-frequency power source used, any power sources may be used so long as they generate a power of an oscillation frequency of from 20 MHz to 450 MHz, and more preferably from 20 MHz to 200 MHz. As for its output, power sources with any output may be used so long as they can generate an electric power suited for the apparatus, ranging from 10 W to 5,000 W.

The present invention can also be effective whatever coefficient of output variation the high-frequency power source has.

The matching circuit used may include those having any constitution, which can be preferably used so long as they can effect load matching to the high-frequency power source. As methods for the matching, automatically adjustable matching is preferable in order to avoid troublesome operations during manufacture. Manually adjustable matching may also be effective in the present invention without any difficulties. With regard to the position where the matching circuit is disposed, it may be provided anywhere without any problems so long as the matching can be effected. The matching circuit may preferably be so disposed that the inductance of the wiring extending from the circuit to the second electrode is made as small as possible. This is preferable because the matching becomes feasible under broader loading conditions.

Materials for the second electrode may include copper, aluminum, gold, silver, platinum, lead, nickel, cobalt, iron, chromium, molybdenum and titanium, or alloys containing as a main component a metal or metals selected from these (e.g., stainless steel), and also composite materials of two or more materials among these, any of which can be preferably used. The second electrode may preferably have a cylindrical shape, and also may have an oval shape or a polygonal shape in section as occasion calls. The second electrode may be optionally further provided with a cooling means. As a specific cooling means, cooling by water, air, liquid nitrogen, Peltier elements or the like may be used as occasion calls.

The first electrode previously described plays a role as the film forming substrate, and may be made of any material and have any shape according to its purpose. For example, in regard to the shape, it may preferably have a cylindrical shape when used in electrophotographic photosensitive members. If necessary, it may have the shape of a flat sheet or other shape. As for the material, it is possible to use copper, aluminum, gold, silver, platinum, lead, nickel, cobalt, iron, chromium, molybdenum and titanium, or alloys containing as a main component a metal or metals selected from these (e.g., stainless steel), and also composite materials of two or more materials among these, as well as insulating materials such as polyester, polyethylene, polycarbonate, cellulose acetate, polypropylene, polyvinyl chloride, polyvinylidene chloride, polystyrene, glass, ceramics and paper covered with conductive materials such as aluminum.

The deposited film forming method of the present invention is carried out, for example, in the following way.

First, to the film forming substrate 102 (serving also as the first electrode) mirror-finished on its surface by means of, e.g., a lathe, the auxiliary substrates 107 and 108 are fitted, and the substrate is set up in the manner that its cylindrical wall surrounds the heating element 103 in the deposition chamber 101.

Next, the material gas feed valve 110 is kept closed and the main valve 104 is opened to evacuate the inside of the deposition chamber through the exhaust tube 105. Then, the material gas feed valve 110 is opened to feed an inert gas for heating as exemplified by argon from the material gas inlet 109 into the deposition chamber, and the flow rate of the heating gas is adjusted so as to provide a desired pressure in the deposition chamber. Thereafter, a temperature controller (not shown) is operated to heat the film forming substrate 102 with the heating element 103. At the time the film forming substrate 102 has been heated to have a desired temperature, the material gas feed valve 110 is closed to stop the inert gas from flowing into the deposition chamber.

To form the deposited film, the material gas feed valve 110 is closed, and given starting material gases, e.g., at least one material gas selected from silane gas, disilane gas, methane gas and ethane gas and optionally a doping gas such as diborane gas or phosphine gas and a dilute gas such as hydrogen, helium or argon are fed into the deposition chamber 101, where the exhaust velocity is adjusted for the pressure to be maintained at tens of Torr to hundreds of mTorr. After the pressure has become stable, the high-frequency power source 112 is switched on and a power of a frequency from 20 MHz to 450 MHz is supplied to cause glow discharge to take place. At this stage, the matching circuit 111 is adjusted so that reflected waves are minimized. The values obtained by subtracting reflected high-frequency power from incident high-frequency power are adjusted to a desired value. At the time a film has been formed in a desired thickness, the glow discharge is stopped, and the material gas feed valve 110 is closed to stop the material gases from flowing into the deposition chamber 101, where the inside of the deposition chamber is once brought to a high vacuum and thereafter the film formation is completed. In the case when deposited film having various functions are formed in layers, the procedure as described above is repeated.

The present invention will be described below in greater detail by giving Examples.

EXAMPLE 1

In the deposited film forming apparatus (a plasma processing apparatus) as shown in FIG. 2, a high-frequency power source of oscillation frequency 105 MHz was provided, and an a-Si film was formed on the cylindrical substrate made of aluminum, to produce an electrophotographic photosensitive member. This photosensitive member is what is called the block type electrophotographic photosensitive member, comprised of a lower blocking layer having the function to block injection of carriers from the substrate, a photoconductive layer having the function to produce photocarriers upon irradiation by light and also transport the photocarriers, and a surface protective layer having the function to block injection of charged carriers into the photoconductive layer side and also protect the surface of the photoconductive layer, which have been formed in layers in this order on the substrate made of aluminum. In the present Example, the high-frequency power was supplied to the second electrode at two points located in the peripheral direction, and supplied in the same way as shown in FIG. 3A. As wiring conductors, copper plates of 5 cm wide were used, which were made equal in length to each other. With regard to the shaft-directional location, the power was supplied at substantially the middle of the second electrode. In the present Example, the film formation was performed with the substrate stationary, and was so managed that the film thickness distribution in the peripheral direction can be measured.

As for film forming conditions, films were formed under conditions of manufacture as shown in Table 1.

In Table 1, the unit sccm (standard cubic centimeter per minute) indicates the flow rate (cc) per minute in the standard condition (0° C., 1 atmospheric pressure). [1 sccm=1 SmlM: the flow rate (ml) per minute in the standard condition (0° C., 1 atmospheric pressure)]

COMPARATIVE EXAMPLE 1

In the conventional deposited film forming apparatus as shown in FIG. 1, a high-frequency power source of oscillation frequency 105 MHz was provided, and an a-Si film was formed on the cylindrical substrate made of aluminum, to produce an electrophotographic photosensitive member. In the present Comparative Example, the film formation was performed with the substrate stationary, and was so managed that the film thickness distribution in the peripheral direction can be measured. In the present Comparative Example, the high-frequency power was supplied to the second electrode at one point as conventionally done, and supplied at the middle in the shaft direction. As a wiring conductor, a copper plate of 5 cm wide similar to those in Example 1 was used.

As for film forming conditions, films were formed in the same manner as in Example 1, under conditions of manufacture as shown in Table 1.

In regard to the electrophotographic photosensitive members produced in Example 1 and Comparative Example 1, evaluation was made in the following way.

(i) Evaluation of Film Thickness Distribution

On each photosensitive member, film thickness was measured at 16 points in the peripheral direction, using an eddy-current instrument for measuring thickness (manufactured by Kett Kagaku Kenkyusho). The film thickness distribution ratio was calculated by dividing the difference between a maximum film thickness and a minimum film thickness by an average film thickness. Then, evaluation was made on the basis of a relative value obtained by assuming as 1 the film thickness distribution ratio of the photosensitive member of Comparative Example 1. Namely, the smaller the value the less the unevenness of the film thickness.

(ii) Electrophotographic Characteristics

The photosensitive members were each set in an electrophotographic apparatus (NP6060, manufactured by Canon Inc., having been modified for test purpose) to make evaluation of initial chargeability and residual potential in the following way.

Chargeability

The electrophotographic photosensitive member is set in the test apparatus, and a high voltage of +6 kV is applied to its corona assembly to effect corona charging. The dark portion surface potential of the electrophotographic photosensitive member is measured using a surface potentiometer. The values obtained by the measurement are normalized by dividing them by the film thickness to remove the effects of film thickness. Evaluation is made on both the large film thickness portion and the small film thickness portion in the peripheral direction.

Residual Potential

The electrophotographic photosensitive member is charged to have a given dark portion surface potential, and immediately thereafter irradiated with relatively intense light in a given amount of light. A xenon lamp is used as a light source, and the surface of the member is irradiated with light from which light of a wavelength range of 550 nm or less has been removed using a filter. At this time the light portion surface potential of the electrophotographic photosensitive member is measured using a surface potentiometer.

These performances were evaluated according to the following.

AA: Very good.

A: Good.

B: No problems in practical use.

C: Problematic in practical use in some instances.

Results of the evaluation are shown together in Table 2. As is seen therefrom, the photosensitive member produced using the conventional apparatus shows good charging characteristics at portions with a large film thickness in the peripheral direction, but very poor characteristics at small-thickness portions. On the other hand, the photosensitive member according to the present invention has achieved a great decrease in uneven film thickness in the peripheral direction and also uniform peripheral-direction characteristics at a good level.

The results of the foregoing Example and Comparative Example have proved that the present invention makes it possible to form deposited films in a uniform film thickness in the peripheral direction and with a good film quality.

EXAMPLE 2

In the deposited film forming apparatus as shown in FIG. 2, a high-frequency power source of oscillation frequency 200 MHz was provided, and an a-Si film was formed on the cylindrical substrate made of aluminum, to produce an electrophotographic photosensitive member. In the present Example, the high-frequency power was supplied to the second electrode at four points, and supplied in the same way as shown in FIG. 3B. As wiring conductors, phosphor bronze plates of 5 cm wide were used, which were made equal in length to each other. With regard to the shaft-directional location, the power was supplied at substantially the middle of the second electrode. In the present Example, the film formation was performed in the state the substrate was rotated by a motor as a drive means.

As for film forming conditions, the film was formed under conditions of manufacture as shown in Table 1.

COMPARATIVE EXAMPLE 2

In the conventional deposited film forming apparatus as shown in FIG. 1, a high-frequency power source of oscillation frequency 200 MHz was provided, and an a-Si film was formed on the cylindrical substrate made of aluminum, to produce an electrophotographic photosensitive member. In the present Comparative Example, the film formation was performed in the state the substrate was rotated. In the present Comparative Example, the high-frequency power was supplied to the second electrode at one point as conventionally done. As a wiring conductor, a phosphor bronze plate of 5 cm wide was used. With regard to the shaft-directional location, the power was supplied at substantially the middle of the second electrode.

As for film forming conditions, the film was formed in the same manner as in Example 2, under conditions of manufacture as shown in Table 1.

In regard to the electrophotographic photosensitive members produced in Example 2 and Comparative Example 2, the film thickness uniformity, charging performance and residual potential were evaluated in the same manner as in Example 1. The film thickness distribution was evaluated by relative comparison, assuming that of Comparative Example 1 as 1.

Results obtained are shown in Table 3. In respect of the unevenness in film thickness in the peripheral direction, there is not so great difference between Example 2 and Comparative Example 2 because the substrate is rotated when films are formed. In respect of the electrophotographic performances, Example 2 shows good results, but Comparative Example 2, lower performances. This is presumably because in Comparative Example 2 a film with good properties and a film with poor properties are formed in layers and hence an averaged performance has become lower.

The results of these Example and Comparative Example have proved that the present invention is effective for more improving film quality also when the film forming substrate is rotated by a rotating means.

EXAMPLE 3

In the deposited film forming apparatus as shown in FIG. 2, a-Si films were formed on the cylindrical substrates made of aluminum, to produce electrophotographic photosensitive members. The high-frequency power was supplied to the second electrode at six points located at equal intervals in the peripheral direction. As wiring conductors, aluminum plates of 3 cm wide were used, some of which were more or less different in length (a shorter wiring conductor had a length of about 70% length of the longest wiring conductor). With regard to the shaft-directional location, the power was supplied at substantially the middle of the second electrode. The film formation was performed with the substrate stationary, and was so managed that the film thickness distribution in the peripheral direction can be measured.

In the present Example, films were formed on four drums (film forming substrates) in total, using a high-frequency power source at a frequency of 20 MHz, 50 MHz, 300 MHz or 450 MHz under film forming conditions as shown in Table 4. These photosensitive members were each what is called the function separated electrophotographic photosensitive member, comprised of a charge transport layer having the function to block injection of carriers from the substrate and also transport photocarriers, a charge generation layer having the function to produce photocarriers upon irradiation by light and a surface protective layer having the function to block injection of charged carriers into the charge generation layer side and also protect the surface of the charge generation layer, which have been formed in layers in this order on the substrate made of aluminum.

Evaluation on each photosensitive member was made in the same manner as in Example 1. As a result, the same good results as in Example 1 were obtained in all photosensitive members. This has proved that the present invention is effective in all instances where the frequencies of high-frequency power are 20 MHz to 450 MHz and also that the present invention is effective without any adverse effects when the wiring conductors extending from the matching circuit to the second electrode are more or less different in length.

The photosensitive members obtained were each also set in a copying machine NP-6650, manufactured by Canon K. K., to reproduce images. As a result, no uneven halftone images were seen and uniform images were obtained. A character original was also copied. As a result, sharp images with a high black density were obtained. In the copying of a photograph original, it was also possible to obtain sharp images faithful to the original.

EXAMPLE 4

In the deposited film forming apparatus as shown in FIG. 2, an a-Si film was formed on the cylindrical substrate made of aluminum, to produce an electrophotographic photosensitive member. The high-frequency power was supplied to the second electrode at two points located at equal intervals in the peripheral direction. As wiring conductors, aluminum plates of 5 cm wide were used, which were made equal in length to each other. With regard to their location for power supply, the wiring conductors were connected to the second electrode at substantially the middle but at positions deviated by 10 or so cm from each other in the shaft direction thereof. The film formation was performed with the substrate stationary, and was so managed that the film thickness distribution in the peripheral direction can be measured.

In the present Example, the film was formed using a high-frequency power source at a frequency of 150 MHz under film forming conditions as shown in Table 4.

Evaluation on the photosensitive member was made in the same manner as in Example 1. As a result, the same good results as in Example 1 were obtained.

The photosensitive member obtained was also set in a copying machine NP-6650, manufactured by Canon K. K., to reproduce images. As a result, no uneven halftone images were seen and uniform images were obtained. A character original was also copied. As a result, sharp images with a high black density were obtained. In the copying of an original photograph, it was also possible to obtain sharp images faithful to the original.

The results of Example 4 have proved that the present invention is effective also when there is some deviation between the locations for supplying the high-frequency power to the second electrode in the shaft direction.

TABLE 1

| Feed gases | Feed rate | Power supply | Deposition chamber internal pressure | Layer thickness |
|---|---|---|---|---|
| Lower blocking layer | | | | |
| $SiH_4$ | 300 sccm | 400 W | 0.2 Torr | 1 μm |
| $H_2$ | 500 sccm | | | |
| NO | 8 sccm | | | |
| $B_2H_6$ | 2,000 ppm (concentration) | | | |
| Photoconductive layer | | | | |
| $SiH_4$ | 500 sccm | 600 W | 0.5 Torr | 20 μm |
| $H_2$ | 500 sccm | | | |
| Surface protective layer | | | | |
| $SiH_4$ | 50 sccm | 100 W | 0.4 Torr | 1 μm |
| $CH_4$ | 500 sccm | | | |

TABLE 2

| | Example 1 | Comparative Example 1 |
|---|---|---|
| Film thickness distribution | 0.42 | 1.0 |
| Chargeability at maximum film thickness portion | AA | AA |
| Chargeability at minimum film thickness portion | AA | C |
| Residual potential | A | A |

TABLE 3

| | Example 2 | Comparative Example 2 |
|---|---|---|
| Film thickness distribution | 0.47 | 0.48 |
| Chargeability at maximum film thickness portion | AA | B |
| Chargeability at minimum film thickness portion | AA | B |
| Residual potential | A | A |

TABLE 4

| Feed gases | Feed rate | Power supply | Deposition chamber internal pressure | Layer thickness |
|---|---|---|---|---|
| Charge transport layer | | | | |
| $SiH_4$ | 100 sccm | 500 W | 0.3 Torr | 15 μm |
| $H_2$ | 300 sccm | | | |
| $CH_4$ | 200 sccm | | | |
| $B_{2H6}$ | 10 ppm (concentration) | | | |
| Charge generation layer | | | | |
| $SiH_4$ | 300 sccm | 400 W | 0.5 Torr | 2 μm |
| $H_2$ | 500 sccm | | | |
| Surface protective layer | | | | |
| $SiH_4$ | 20 sccm | 150 W | 0.4 Torr | 0.5 μm |
| $CH_4$ | 500 sccm | | | |

As described above, the present invention can provide a plasma processing method and a plasma processing apparatus that enable uniform and high-speed plasma processing on substrates with a large area even when plasma processing that utilizes a high-frequency power of 20 MHz to 450 MHz is carried out.

According to the present invention, the plasma processing can be carried out at a cost little different from that in conventional apparatuses. Otherwise, uniform and high-speed plasma processing can be carried out without rotating the substrate, making it unnecessary to provide the substrate rotating different from that in conventional apparatuses. Uniform and high-speed plasma processing can be carried out without rotating the substrate, making it unnecessary to provide the substrate rotating mechanism, and hence it becomes possible to provide a plasma processing apparatus that can enjoy a much lower production cost.

In addition, the processing time can be shortened, and hence not only the semiconductor devices to be obtained can be produced at a lower cost, but also, when films are formed, they can be formed in a uniform film thickness and with an improved film quality. Thus, it becomes possible to provide superior semiconductor devices.

Moreover, more uniform and high-quality plasma processing can be carried out when the points at which the high-frequency power is supplied are located at equal intervals or substantially equal intervals in the peripheral direction of the second electrode.

When the electric power is supplied from a single high-frequency power source through cables branched in plurality after it has passed through the matching circuit, the matching of the high-frequency power becomes easy and hence better plasma processing can be performed.

When the cables are rectangular in cross sections, the electric power can be more efficiently supplied. Further, when the power supply points are located at the middle or in the vicinity thereof in the up-and-down direction (or the shaft direction), uniform plasma processing can be performed.

The present invention is by no means limited to the deposited film forming apparatuses and deposited film forming methods as described in the foregoing Examples, and can be applied to other plasma processing apparatuses and plasma processing methods such as dry etching apparatuses and dry etching methods where an etching gas is fed to generate plasma to carry out etching.

The present invention can be applied to the production of not only the electrophotographic photosensitive members as described above, but also semiconductor devices including optical input devices and active devices as previously stated.

Needless to say, the present invention can be appropriately modified and combined within the scope of the purpose of the present invention.

What is claimed is:

1. A plasma processing method carried out in a reaction chamber provided with a first electrode placed in a space that can be evacuated and a second electrode disposed to surround the first electrode, said method comprising supplying a high-frequency power to the second electrode to generate plasma to carry out plasma processing on the first electrode, wherein said high-frequency power is supplied to the second electrode at two points at least.

2. The plasma processing method according to claim 1, wherein said plasma processing is processing to form a deposited film.

3. The plasma processing method according to claim 1, wherein said plasma processing is etching.

4. The plasma processing method according to claim 1, wherein said high-frequency power has a frequency ranging from 20 MHz to 450 MHz.

* * * * *

UNITED STATES PATENT AND TRADEMARK OFFICE
CERTIFICATE OF CORRECTION

PATENT NO. : 5,945,353
DATED : August 31, 1999
INVENTOR(S) : JUNICHIRO HASHIZUME ET AL.

It is certified that error appears in the above-identified patent and that said Letters Patent is hereby corrected as shown below:

COLUMN 4

Line 5, "when" should be deleted.

COLUMN 5

Line 11, "formed" should read --formed when--.

COLUMN 14

In Table 4, "$B_{2H6}$" should read --$B_2H_6$--;
Line 32, "Otherwise, uniform and high-" should be deleted.

UNITED STATES PATENT AND TRADEMARK OFFICE
CERTIFICATE OF CORRECTION

PATENT NO. : 5,945,353
DATED : August 31, 1999
INVENTOR(S) : JUNICHIRO HASHIZUME ET AL.

It is certified that error appears in the above-identified patent and that said Letters Patent is hereby corrected as shown below:

COLUMN 14 (Contd.,)

Lines 33 to 35 should be deleted.

Signed and Sealed this

Sixteenth Day of May, 2000

Attest:

Q. TODD DICKINSON

Attesting Officer            Director of Patents and Trademarks